United States Patent
DeMars (10) Patent No.: US 12,178,013 B2
(45) Date of Patent: Dec. 24, 2024

(54) RETAINER FOR A MANIFOLD

(71) Applicant: Hoffman Enclosures, Inc., Anoka, MN (US)

(72) Inventor: Allen DeMars, Elk River, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 404 days.

(21) Appl. No.: 17/547,658

(22) Filed: Dec. 10, 2021

(65) Prior Publication Data

US 2022/0192054 A1 Jun. 16, 2022

Related U.S. Application Data

(60) Provisional application No. 63/124,216, filed on Dec. 11, 2020.

(51) Int. Cl.
| | |
|---|---|
| *F16L 3/237* | (2006.01) |
| *F16L 3/12* | (2006.01) |
| *H05K 5/02* | (2006.01) |
| *H05K 7/20* | (2006.01) |
| *A47B 57/50* | (2006.01) |
| *H05K 7/14* | (2006.01) |

(52) U.S. Cl.
CPC ....... *H05K 7/20272* (2013.01); *H05K 5/0221* (2013.01); *A47B 57/50* (2013.01); *F16L 3/12* (2013.01); *F16L 3/237* (2013.01); *H05K 7/1401* (2013.01)

(58) Field of Classification Search
CPC .. H05K 7/20272; H05K 5/022; H05K 5/0204; F16L 3/237; F16L 3/12; F28F 9/002; F28F 9/02
See application file for complete search history.

(56) References Cited

U.S. PATENT DOCUMENTS

| | | | |
|---|---|---|---|
| 3,219,157 A | 11/1965 | Gordon | |
| 3,905,712 A * | 9/1975 | McConnell | F16B 5/065 |
| | | | 211/208 |
| 3,986,318 A * | 10/1976 | McConnell | F16B 12/34 |
| | | | 403/384 |
| 4,955,743 A * | 9/1990 | King | A47B 57/50 |
| | | | 211/192 |
| 5,202,538 A | 4/1993 | Skirpan | |
| 6,230,910 B1 * | 5/2001 | Olsson | A47B 57/50 |
| | | | 248/221.11 |
| 7,033,267 B2 | 4/2006 | Rasmussen | |

(Continued)

FOREIGN PATENT DOCUMENTS

EP 3668285 A1 6/2020

OTHER PUBLICATIONS

U.S. Pat. No. 6,902,77A, granted Dec. 31, 1901 to Hatfield.

*Primary Examiner* — Tan Le
(74) *Attorney, Agent, or Firm* — Quarles & Brady LLP (57) ABSTRACT

A retainer for securing a manifold can include an aperture that can be positioned adjacent to a retention portion of a keyhole slot in a mounting structure. The retainer can be flexed away from the mounting structure when a mounting protrusion on the manifold extends through a receiving portion of the keyhole slot. The retainer can resiliently move toward the mounting structure when the mounting protrusion is moved into the retention portion of the keyhole slot to capture the mounting protrusion within the retention portion of the keyhole slot.

20 Claims, 5 Drawing Sheets

(56) References Cited

U.S. PATENT DOCUMENTS

| | | |
|---|---|---|
| 7,112,131 B2 | 9/2006 | Rasmussen et al. |
| 7,715,202 B2 * | 5/2010 | Morita ................ H05K 7/1405 |
| | | 361/801 |
| 7,878,888 B2 | 2/2011 | Rasmussen et al. |
| 8,087,979 B2 | 1/2012 | Rasmussen |
| 8,403,736 B2 | 3/2013 | Rasmussen et al. |
| 8,456,833 B2 | 6/2013 | Eagle |
| 8,837,129 B2 | 9/2014 | Fu |
| 8,837,158 B2 * | 9/2014 | Lu ....................... H05K 7/1487 |
| | | 361/740 |
| 9,161,465 B2 | 10/2015 | Chen et al. |
| 9,246,318 B2 | 1/2016 | Hussey et al. |
| 10,178,801 B2 | 1/2019 | Liu et al. |
| 10,185,375 B2 | 1/2019 | Franz et al. |
| 10,299,413 B2 | 5/2019 | Cui et al. |
| 10,412,850 B1 * | 9/2019 | Chen .................... H05K 7/1487 |
| 10,477,719 B1 | 11/2019 | An et al. |
| 10,609,840 B2 | 3/2020 | Gao et al. |
| 10,674,636 B2 | 6/2020 | Marroquin et al. |
| 10,701,838 B1 | 6/2020 | Conroy et al. |
| 10,827,648 B2 | 11/2020 | Liu et al. |
| 2002/0027116 A1 * | 3/2002 | Herzog ................. A47B 57/50 |
| | | 211/192 |
| 2007/0132224 A1 | 6/2007 | Hall |
| 2012/0255709 A1 | 10/2012 | Kinder et al. |
| 2014/0368997 A1 | 12/2014 | Wang et al. |
| 2019/0289743 A1 | 9/2019 | Chen et al. |
| 2020/0163251 A1 | 5/2020 | Chopra et al. |

* cited by examiner

RETAINER FOR A MANIFOLD

CROSS-REFERENCE TO RELATED APPLICATIONS

This application claims priority to U.S. Provisional Application No. 63/124,216, filed Dec. 11, 2020 and titled "Retainer for a Manifold," the entirety of which is incorporated herein by reference.

BACKGROUND

In some cooling system applications, a manifold may deliver flows of cooling fluid to and from electronics supported on a rack within a cabinet or stack. The manifold can be attached to a mounting structure, which can include the rack. During shipment, installation, or use, a secured connection between the manifold and the mounting structure can be important.

SUMMARY

Some embodiments of the invention can provide a retainer for securing a manifold, with a mounting feature, to a mounting structure, with a keyhole slot. The retainer can include a body having a first end and a second end opposite the first end. The body can be configured to be affixed to the mounting structure at the second end and can define a flex axis at the affixation location. An aperture can be provided in the first end of the body. The aperture can be configured to be positioned adjacent a retention portion of the keyhole slot. The body can be configured to flex away from the mounting structure about the flex axis upon contact with the mounting feature, when the mounting feature extends through a receiving portion of the keyhole slot, and can rebound when the mounting feature is further received within the retention portion of the keyhole slot, so that the mounting feature is captured within the aperture.

Some embodiments of the invention can provide a retainer assembly for securing a manifold to a mounting structure. The retainer assembly can include a retainer having a body. The body can have a first end, a second end opposite the first end, and an aperture in the first end. The body can be configured to be affixed to the mounting structure at the second end so that the aperture is positioned adjacent a retention portion of a keyhole slot in the mounting structure. The retainer assembly can further include a bushing with a groove and a bore. The bore can extend along a bushing axis and can be configured to receive a stud extending from the manifold. The body can be configured to flex away from the mounting structure upon contact with the bushing, when the bushing extends through a receiving portion of the keyhole slot, and can rebound when the retention portion of the keyhole slot is received within the groove of the bushing, so that the bushing is captured within the aperture.

Some embodiments of the invention can provide a method for securing a connection between a manifold, with a spool bushing mounted thereto, and a mounting structure, with a keyhole slot. The method can include inserting the spool bushing into the keyhole slot. The spool bushing can contact and thereby flex a retainer affixed to the mounting structure. The method can further include sliding the spool bushing along the keyhole slot to engage the spool bushing with the mounting structure and captivating the spool bushing within an aperture in the retainer.

Some embodiments of the invention can provide a manifold system for a cooling system. A manifold can have a mounting protrusion. A mounting structure can have a keyhole slot, with a receiving portion of the keyhole slot sized to receive the mounting protrusion and a retention portion of the keyhole slot that is in communication with the receiving portion can be sized to retain the mounting protrusion. A retention plate can have a first end and a second end opposite the first end. The retention plate can be affixed to the mounting structure at the second end to define a flex axis, and can be flexible at the flex axis to flex between a retention configuration and a release configuration, with the second end of the retention plate being farther from the mounting structure in the retention release configuration than in the retention configuration. The retention plate can have an aperture in the first end, the aperture being positioned to be aligned with the retention portion of the keyhole slot. The retention plate can be configured to: flex away from the mounting structure to the release configuration upon contact with the mounting protrusion, when the mounting protrusion is received through the receiving portion of the keyhole slot; and rebound toward the mounting structure, to the retention configuration when the mounting protrusion is received within the retention portion of the keyhole slot, to capture the mounting protrusion in the retention portion and secure the manifold to the mounting structure.

Some embodiments of the invention can provide a manifold system for securing a manifold of a cooling system to a mounting structure. A mounting structure can have a slot having a first portion and a second portion that is narrower than the first portion. A retainer can have a retainer body, the retainer body having a first end, a second end opposite the first end, and an aperture in the first end. The second end of the retainer body can be affixed to the mounting structure so that the aperture is positioned adjacent the second portion of the slot. A bushing can have a major diameter and a groove with a minor diameter, can extend along a bushing axis and can be configured to be secured to the manifold to extend away from the manifold to be received through the keyhole slot. The major diameter can be sized to be received in the first portion of the slot but not in the second portion of the slot, and the minor diameter can be sized to be received in the first and second portions of the slot. The retainer body can be configured to be deflected away from the mounting structure upon contact with the bushing, when the bushing extends through the first portion of the slot, and to rebound to receive the bushing in the aperture and thereby capture the bushing within the slot when the groove of the bushing is slid into the second portion of the slot.

Some embodiments of the invention can provide a method for a manifold. A manifold assembly can be aligned with a mounting structure. The manifold assembly can be moved toward the mounting structure to insert a mounting protrusion of the manifold assembly in an axial insertion direction into a receiving portion of a keyhole slot. The mounting protrusion can thereby extend through the keyhole slot to contact a retention plate that is secured to the mounting structure at a first end of the retention plate and flexes the retention plate to deflect a second end of the retention plate away from the mounting structure. The manifold assembly can be moved along the mounting structure in a seating direction to move the mounting protrusion from the receiving portion of the keyhole slot into a retention portion of the keyhole slot that prevents movement of the mounting protrusion out of the keyhole slot in a direction opposite the axial insertion direction. The retention plate can thereby resiliently unflex to move the second end of the retention plate toward the mounting structure so that the mounting protrusion is received in an aperture in the first end of the retention plate that is aligned with the retention portion of the keyhole slot. The mounting protrusion can be thereby retained in the retention portion of the keyhole slot against movement in a direction opposite the seating direction.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Also as used herein, unless otherwise limited or defined, "or" indicates a non-exclusive list of components or operations that can be present in any variety of combinations, rather than an exclusive list of components that can be present only as alternatives to each other. For example, a list of "A, B, or C" indicates options of: A; B; C; A and B; A and C; B and C; and A, B, and C. Correspondingly, the term "or" as used herein is intended to indicate exclusive alternatives only when preceded by terms of exclusivity, such as "either," "one of," "only one of," or "exactly one of." For example, a list of "one of A, B, or C" indicates options of: A, but not B and C; B, but not A and C; and C, but not A and B. A list preceded by "one or more" (and variations thereon) and including "or" to separate listed elements indicates options of one or more of any or all of the listed elements. For example, the phrases "one or more of A, B, or C" and "at least one of A, B, or C" indicate options of: one or more A; one or more B; one or more C; one or more A and one or more B; one or more B and one or more C; one or more A and one or more C; and one or more of A, one or more of B, and one or more of C. Similarly, a list preceded by "a plurality of" (and variations thereon) and including "or" to separate listed elements indicates options of multiple instances of any or all of the listed elements. For example, the phrases "a plurality of A, B, or C" and "two or more of A, B, or C" indicate options of: A and B; B and C; A and C; and A, B, and C.

Also as used herein, unless otherwise limited or defined, the terms "about" and "approximately" refer to a range of values ±5% of the numeric value that the term precedes. As a default the terms "about" and "approximately" are inclusive to the endpoints of the relevant range, but disclosure of ranges exclusive to the endpoints is also intended.

Also as used herein, unless otherwise limited or defined, "integral" and derivatives thereof (e.g., "integrally") describe elements that are manufactured as a single piece without fasteners, adhesive, or the like to secure separate components together. For example, an element stamped as a single-piece component from a single piece of sheet metal, without rivets, screws, or adhesive to hold separately formed pieces together is an integral (and integrally formed) element. In contrast, an element formed from multiple pieces that are separately formed initially, then later connected together, is not an integral (or integrally formed) element.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Some of the discussion below describes a retainer that can be used to help secure a manifold of a fluid distribution system (e.g., a liquid cooling system for servers or other electronics) to a mounting structure. For example, as detailed below, some embodiments of a retainer according to the invention can be used to secure manifolds for high density liquid cooling systems to support members within or near enclosures, to position the manifold to provide or receive cooling liquid flows for adjacent server racks. However, the context and particulars of this discussion are presented as examples only and some embodiments can be similarly employed in other systems.

In some embodiments, a retainer according to the invention can increase stability and security of attachment during transportation of a manifold and a mounting structure (e.g., when the manifold is attached to the mounting structure at a remote location then shipped to an operational installation). In some embodiments, a retainer according to the invention can also provide increased stability and security during installation of a manifold in a server rack assembly and also during operation of the associated liquid cooling (or other) system.

For example, when manifolds are shipped along with the associated mounting structures to be used in a server rack assembly, they are generally shipped connected. It is useful to ensure that this connection is maintained during shipment, including to improve installation times at operational installations. Further, if a manifold becomes disconnected from a mounting structure during shipment, relative movement of the parts may cause not only cosmetic damage but also functional damage.

Conventional arrangements for securing connections between manifolds and mounting structures include attaching zip ties or wire. Although this approach can be useful, it requires additional labor and material to ready assemblies for shipment, and additional labor and waste to remove the ties prior to installation. There is also the potential for these ancillary ties to permit some movement during shipping or installation, and thus cause at least cosmetic damage to the relevant manifolds or mounting structures.

Ensuring a secure connection between a manifold and a mounting structure can also be beneficial in other contexts. For example, whether a manifold and a mounting structure are shipped separately or assembled together, it may be useful to ensure a secure connection between the manifold and the mounting structure during installation and operation of the relevant system.

Embodiments of the invention can address these or other issues by helping to ensure a secure connection between a manifold and a mounting structure. In particular, in some embodiments, a retainer can include a flexible member that can be secured to a larger support structure so that an opening in the flexible member is in partial alignment with an opening in the support structure that provides an attachment point for a manifold. With the retainer thus aligned, installation of the manifold can include moving a mounting protrusion of the manifold (e.g., a separately manufactured bushing) into the opening on the support structure and thereby flexing the flexible member (including the opening therein) to a release configuration. Subsequently moving the manifold to an installed orientation can then permit the flexible member to resiliently return from the release configuration to a retention configuration, so that the mounting protrusion is captured by the opening in the flexible member and thereby prevented from being removed from the opening in the mounting structure. Thus, via resilient movement of the flexible member during installation of the manifold, the manifold can be automatically secured by the flexible member against removal from the mounting structure.

In some embodiments, a resiliently flexible retainer (e.g., a metal or composite plate) can be affixed to the mounting structure with an aperture of the retainer in alignment with (e.g., fully overlapping with, along an insertion direction) a narrower, retention portion of a keyhole slot of the mounting structure. Further, the aperture can be out of alignment with (e.g., not overlapping with at least part of, along the insertion direction) a wider, receiving portion of the keyhole slot. When a mounting feature (e.g., a fastener) on the manifold is initially inserted through the receiving portion of the keyhole slot in the insertion direction, the mounting feature can thus be out of alignment with the aperture of the retainer and can accordingly displace the retainer away from the mounting structure. Thereafter, moving the mounting feature into the retention portion of the keyhole slot can align the mounting feature to be received through the aperture on the retainer. This can allow the retainer to resiliently move back toward the mounting structure so that the mounting feature extends into and is captured within the aperture on the retainer and the retainer thereby prevents the mounting structure from moving back into the receiving portion of the keyhole slot.

In some embodiments, the retainer can be engaged during the connection of the manifold to the mounting structure, requiring no additional labor to secure the connection between the manifold and the mounting structure. In some cases, mounting features on a manifold can include protrusions extending from a wall on the manifold. For example, a spool bushing or other fastener or boss can be attached to the manifold and can be sized to be received and engaged within a keyhole slot in the mounting structure. The retainer can then capture the spool bushing within an aperture sized to receive the spool bushing, which can be aligned with a portion of the keyhole slot in which the spool bushing is located when the manifold is fully installed (i.e., when a final operational connection is provided between the manifold and the mounting structure).

In some embodiments, the retainer can be formed from a resilient material (e.g., spring steel), so that during the installation of the manifold onto the mounting structure the spool bushing can contact the retainer when it is inserted into the keyhole slot and can resiliently flex the retainer away from the mounting structure. This can allow the spool bushing to move relatively freely within the keyhole slot until, once the spool bushing is seated and aligned with the aperture, the retainer rebounds to capture the spool bushing within the aperture and prohibit movement of the spool bushing within the keyhole slot.

In some cases, a retainer can include a release tab that can be engaged to flex the retainer away from the mounting structure to release (or "decapture") a spool bushing (or other mounting feature) and thereby permit the disconnection of the manifold from the mounting structure. In some embodiments, a release feature can include a hole in the mounting structure allowing a tool to be inserted therethrough, to abut the retainer and, with an applied force, flex the retainer away from the mounting structure to decapture a spool bushing (or other mounting feature).

FIGS. 1-5 illustrate an example retainer 100 in an example retainer assembly 150, according to an embodiment of an invention, in the context of a manifold 10 for delivering liquid to or from a server rack assembly (not shown) to remove heat from electrical equipment (not shown) of various known configurations. In particular, the retainer 100 is arranged to secure the attachment of the manifold 10 to a mounting structure 20 to provide a server assembly with notably secure attachment connections for transport, installation in a larger cooling system, and operation of the cooling system. Generally, the mounting structure 20 can be a structure that is mountable to a server rack assembly or a structural piece of a server rack assembly, as can support the manifold structure 20 relative to a larger installation.

Generally, a retainer can be formed as a flexible body with an elastic response within an intended range of motion. Further, a retainer can generally be secured to a mounting structure so as to be able to be flexed away from the mounting structure by an external force and then resiliently move back toward the mounting structure when the force is removed. In the illustrated example, the retainer 100 has a body 102, formed as an integral plate with a first end 104 and a second end 106 opposite the first end 104. Although only a single instance of the retainer 100 is shown, in some embodiments more than one retainer (e.g., multiple instances of the retainer 100) can be affixed to a mounting structure to secure additional attachment of the manifold 10 to the mounting structure 20 at multiple locations.

Figure 1:
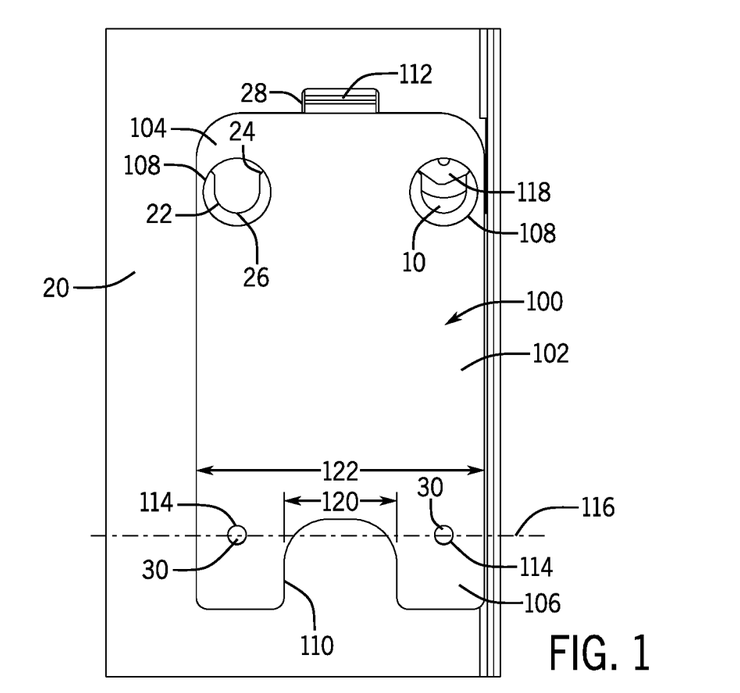
FIG. 1 is a front elevation partial view of a manifold assembly according to an embodiment of the invention, with a retainer according to an embodiment of the invention affixed to a mounting bracket and in a flexed state via contact with a mounting protrusion of a manifold.

Continuing with regard to FIGS. 1 through 4, the retainer 100 is configured to be securely (e.g., non-removably) affixed to the mounting structure 20 with an end still remaining free to flex away from the mounting structure 20. In particular, the second end 106 of the retainer 100 can be mounted to the mounting structure 20, as shown in FIG. 1, with a set of rivets 30 (or other fasteners) at affixation locations 114. Other fasteners for affixing the retainer 100 to the mounting structure 20 are also contemplated. For example, the retainer 100 can be affixed using bolts or screws. Further, although the two affixation locations 114 for the retainer 100 may provide an optimally secure attachment, other configurations are possible.

As also noted above, retainers according to the invention are generally configured to be sufficiently elastic to be able to flex repeatedly away from (and then resiliently back towards) a mounting structure. In the illustrated embodiment, the affixation locations 114, at which the set of rivets 30 affix the retainer 100 to the mounting structure 20, defines a flex axis 116 extending laterally across the second end 106 of the body 102. The first end 104 of the body 102 is thus configured to flex or bend relative to the second end 106—and the mounting structure 20—about the flex axis 116, with additional bending along the length of the body 102 according to generally known principles of mechanics and materials.

Relatedly, the body 102 can be made from a resilient, but pliable material such as an appropriate gauge of spring steel, or another appropriate material, to enable a resilient response throughout the range and frequency of the necessary bending. For example, the retainer 100 is formed as a stamped spring steel plate that is sufficiently thin so as to be readily moved from a rest state, as shown in the retention configuration of FIGS. 3 and 4, to a flexed state as shown in the installation configuration FIGS. 1 and 2, by a manually applied force during installation (or removal) of the manifold 10.

Figure 5:
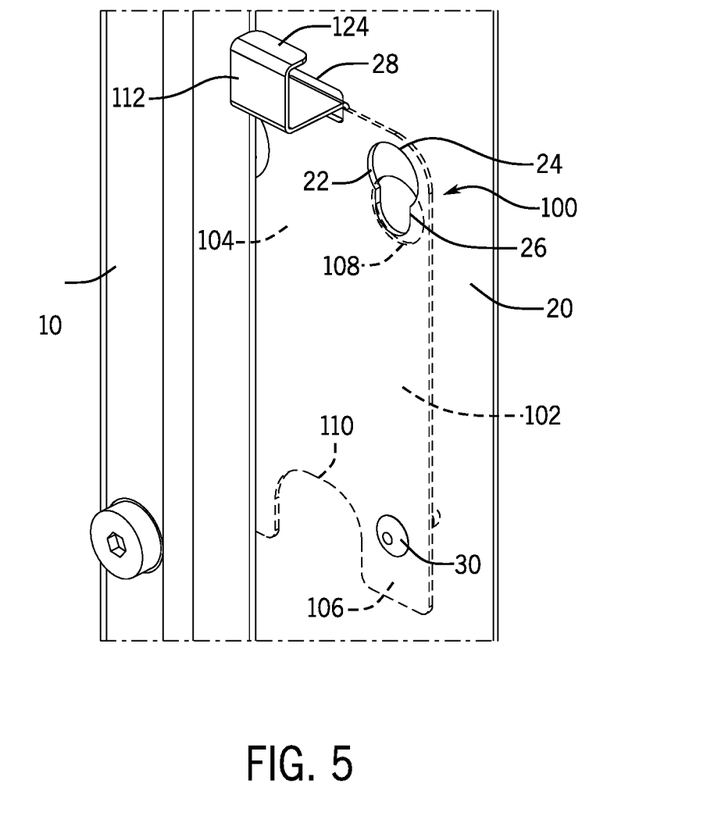

Generally, retainers according to the invention can include one or more apertures arranged to be flexed with the retainer body away from a mounting structure. Further, a retainer can be installed on a corresponding mounting structure so that the one or more apertures on the retainer is aligned with a retention portion of an aperture in a mounting structure for securing a manifold (e.g., is arrayed along a common insertion axis with at least part of the aperture on the mounting structure). For example, two apertures 108 are formed as fully enclosed (e.g., circular) holes in the first end 104 of the body 102. When attached to the mounting structure 20, each of the two apertures 108 can be aligned with a narrower retention portion 26 of a corresponding keyhole slot 22 in the mounting structure 20, as shown in FIGS. 1 and 5 in particular (e.g., aligned so that a central, centroid or other through-axis for the retention portion 26 of the slot 22 is coaxial with a central, centroid or other through-axis for the aperture 108). Further, each of the two apertures 108 can be partly misaligned with a wider receiving portion 24 at an opposing end of the slot 22 (e.g., aligned so that at least part of the solid form of the body 102 adjacent to the apertures 108 overlaps with the receiving portion 24).

Figure 2:
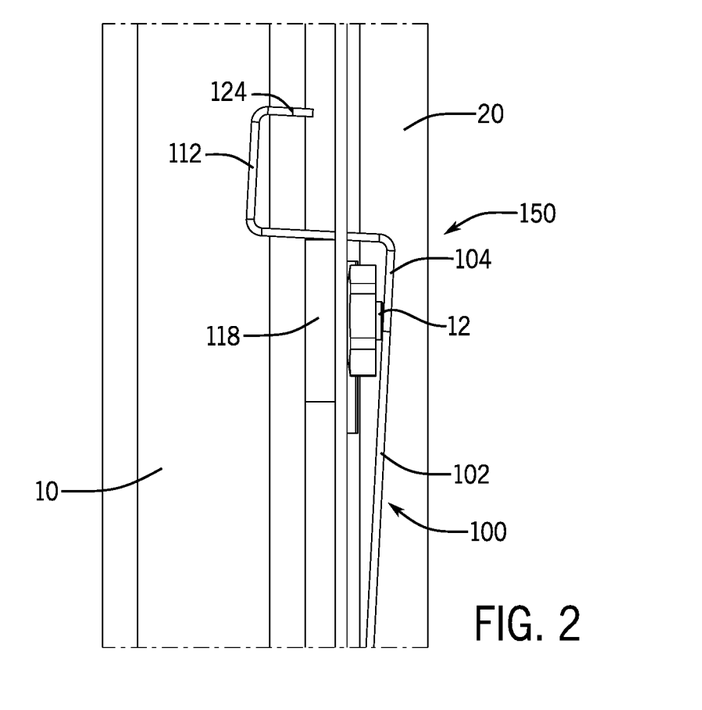
FIG. 2 is a side elevation partial view of the assembly of FIG. 1
Figure 3:
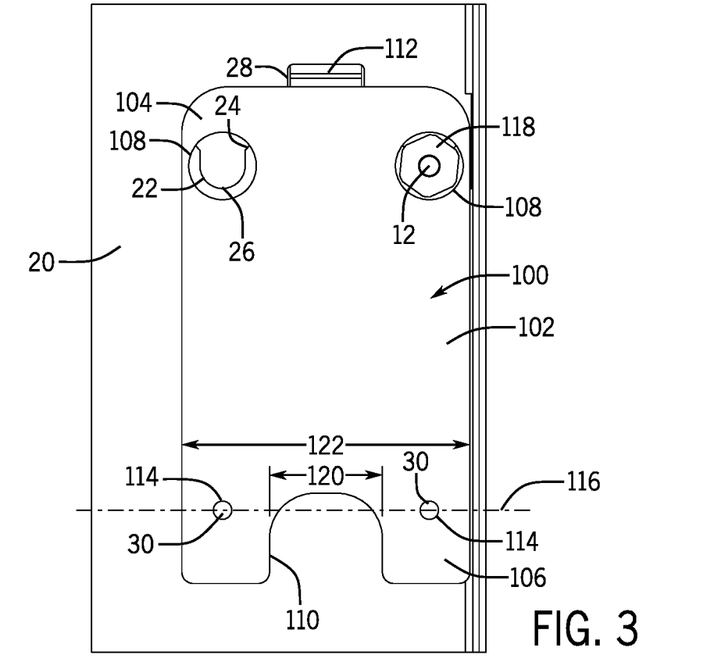
FIGS. 3, 4 and 5 are a front elevation, side elevation, and rear isometric views, respectively, of the assembly of FIG. 1, with the retainer in a flexed state and the mounting protrusion captured by the retainer, and with the mounting bracket shown as transparent in FIG. 5.
Figure 4:
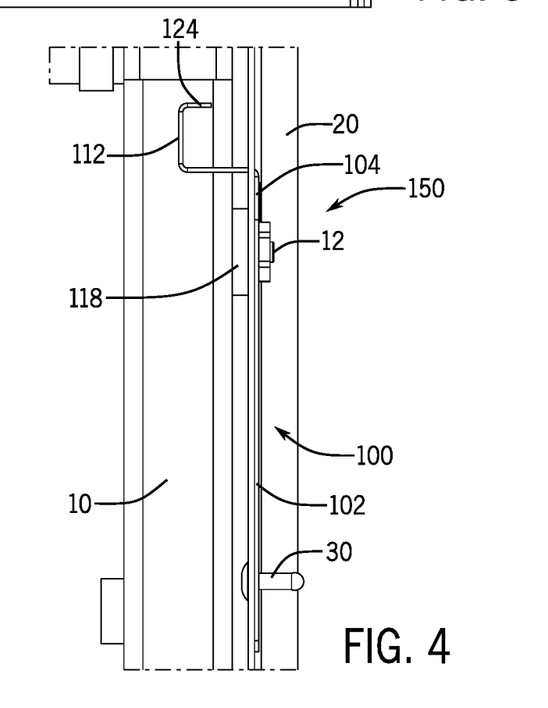

The aperture 108 can be sized to receive and thereby capture a mounting feature (e.g., a spool bushing 118 or other protrusion or fastener) that extends from the manifold 10, as discussed further below and shown in FIGS. 3 and 4, when the retainer 100 is in a retention configuration (e.g., as shown in FIG. 3). Thus, for example, due to the misalignment of the apertures 108 and the receiving portions 24, when the spool bushing 118 is inserted into the receiving portion 24 of the keyhole slot 22 as shown in FIGS. 1 and 2, the bushing 118 contacts the body 102 of the retainer 100 to flex the first end 104 of the retainer away from the mounting structure 20. The bushing 118 can thus be sufficiently received into the keyhole slot 22 in an axial insertion direction so that the bushing 118 can be slid into the retention portion 26 of the keyhole slot 22, with corresponding movement of the manifold 10 to an installed configuration. Due to the alignment of the apertures 108 with the retention portions 26 of the keyhole slots 22, the body 102 can then resiliently return to a retention configuration, as shown in FIGS. 3 and 4, with the bushing 118 thus received into the corresponding aperture 108 and thereby prevented from moving back to the receiving portion 24 of the keyhole slot 22 for removal of the bushing 118 from the slot 22 (and removal of the manifold 10 from the mounting structure 20).

In some cases, the inclusion of multiple apertures on a retainer can allow multiple manifolds to be secured by a single retainer or can allow a manifold to be secured at multiple locations by a single retainer. However, in some embodiments, a different number of apertures can be provided in a body of a retainer. For example, only a single aperture can be provided in some cases, or one or more additional apertures can provide one or more additional locations for securing a manifold.

In some embodiments, a retainer can include features to provide desired bending characteristics. Looking again at FIG. 1, for example, the retainer 100 includes a notch 110 in the second end 106 of the body 102. The notch 110 extends into the body 102 from a lower edge of the second end 106 toward the first end 104, with a notch width 120 defined along the flex axis 116. Further, the notch 110 generally terminates at or near (e.g., extends across) the flex axis 116. The notch 110 has a notch width 120 defined along the flex axis 116. The dimensional relationship between the notch width 120 and a second end width 122 of the body 102 along the flex axis 116, can at least partly define the flexibility of the retainer 100. For example, the more the notch width 120 is increased relative to the second end width 122, the more flexible the retainer 100 will tend to be (with other characteristics remaining equal). In some embodiments, the notch width 120 is in the range of about 25 percent to about 75 percent of the second end width 122, as can allow for sufficient capturing strength and resilience for proper operation of the retainer 100, while still allowing manual flexing of the retainer 100 by an average worker. In some embodiments, however, it is contemplated that a retainer may not have a notch or may have a notch that is differently configured than the notch 110 (e.g., differently sized, shaped, or located).

In some embodiments, a retainer can include a release feature that can be used to bend the retainer to release a captured mounting feature of a manifold. For example, the retainer 100 includes a release tab 112, as show in FIGS. 2 and 4 in particular. Generally, a release tab can be configured to extend from a retainer body and through or around a wall of a mounting structure to which the retainer body is mounted. Thus configured, a release tab can provide an interface for actuating the release tab from a side of the mounting structure that is opposite to a side of the mounting structure on which the body is located (e.g., from the same side on which a manifold is disposed). In the illustrated embodiment, the release tab 112 extends from the first end 104 perpendicular to a plane defined by the body 102 and extends through a hole 28 in the mounting structure 20 (see FIGS. 3 and 5) in the direction of the manifold 10. The release tab 112 is thus arranged to be urged in the direction of the mounting structure 20, by force applied from the same side of the mounting structure 20 as the manifold 10, to flex the first end 104 of the body 102 away from the mounting structure 20 so that the retainer 100 decaptures the spool bushing 118.

In some cases, a retainer may include a stop that can prevent the retainer from being flexed excessively away from a retention position. In the illustrated embodiment, the release tab 112 has a form-stop 124 configured to limit the travel of the release tab 112. The form-stop 124 can abut the mounting structure 20 when a first end 104 of the body 102 is flexed to a point where the aperture 108 is no longer captivating the spool bushing 118, thereby providing tactile feedback to indicate that the spool bushing 118 can be removed from the keyhole slot 22. The form-stop 124 can also prevent the release tab 112 from traveling entirely though the hole 28 in the mounting structure, such as might result in the retainer 100 being trapped in a deformed configuration. The form-stop 124 may also reduce the likelihood that the body 102 will be plastically deformed from flexing too far while being urged away from the mounting structure 20. In some embodiments, the release tab 112 can be replaced or supplemented with another form of a release (not shown), including releases requiring activation with a special or general purpose tool. For example, another form of the release can include a specially shaped hole (not shown) through which only a special tool can be received, so that only those with access to a particular tool can easily urge the first end 104 further away from the mounting structure 20 to decapture the spool bushing 118 and remove the manifold 10.

Figure 6:
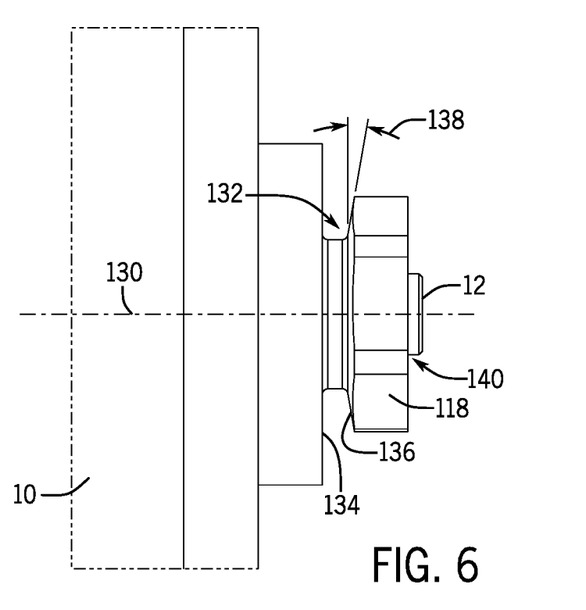
FIG. 6 is a side elevation view of an example mounting protrusion for the manifold of FIG. 1, configured as a spool bushing.
Figure 7:
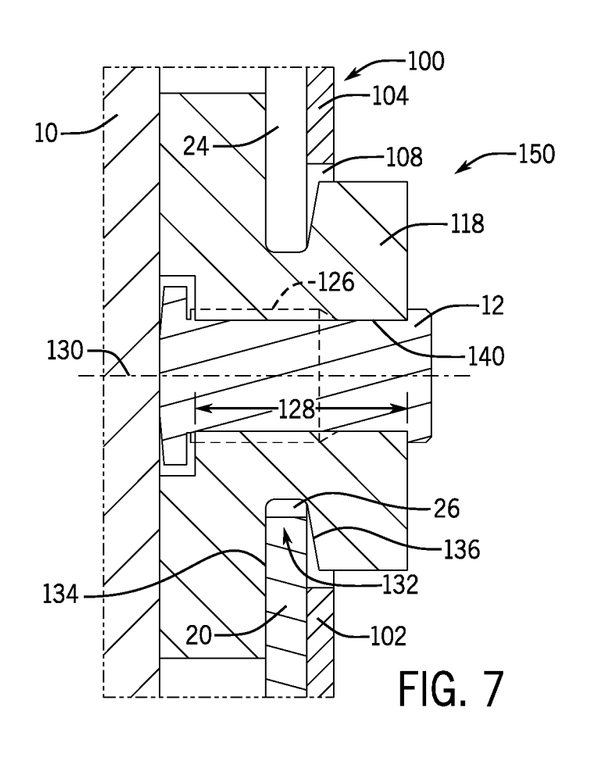
FIG. 7 is a cross-sectional view of the spool bushing of FIG. 6 captured by the retainer of FIG. 1.

In some embodiments, specialized mounting features (e.g., specifically contoured protrusions) can provide further benefits. For example, as shown in FIGS. 6 and 7 in particular, the spool bushing has a bore 140 with a bore length 128 that extends along a bushing axis 130. The bore 140 is configured to receive a stud 12 extending from the manifold 10. The spool bushing 118 can thereby be secured to the manifold 10 through a threaded engagement between the stud 12 and a threaded portion 126 of the bore 140.

In some embodiments the spool bushing 118 can be polymeric. For example, the thermal properties of a spool bushing 118 formed of appropriate polymers can provide a thermally insulative barrier between the manifold 10 and the mounting structure 20, as may contribute to improved thermal efficiency for the larger cooling system. In some cases, use of polymeric or other relatively soft materials can also aid in securing a spool bushing to the stud 12. For example, in some embodiments, the bore 140 can be tapped before installation along less than the full bore length 128 (e.g., only within a tapped region 126). The untapped portion of the bore 140 can act as a thread-lock as threads are formed within the untapped portion of the bore 140 as the bore 140 is threaded onto the stud 12. The formation of threads during installation along at least part of the bore 140 can help to better bond to the stud 12 to reduce the likelihood of unthreading. In some embodiments, the threaded region 126 of the bore 140 can be threaded along only about 70 percent of the bore length 128.

In some embodiments, a mounting protrusion can have a first portion with a major width (e.g., major diameter) and a second portion with a minor width (e.g., minor diameter) that is smaller than the major width. Further, the major width can be sized to be smaller than a characteristic dimension (e.g., lateral width or diameter) of a receiving portion of an aperture in a mounting structure (e.g., a keyhole slot), and larger than a characteristic dimension (e.g., lateral width or diameter) of a retention portion of the aperture, and the minor width can be sized to be smaller than the characteristic dimensions of the receiving and retention portions of the aperture.

Correspondingly, in some cases, a first portion (and major width) of a mounting protrusion can be received through a receiving portion of a slot on a mounting structure, to align a second portion (and minor width) of the mounting protrusion with side walls of a retention portion of the aperture. The mounting protrusion can then be slid along the aperture on the mounting structure, so that the narrower second portion of the mounting protrusion is received in the retention portion of the slot, and the wider first portion is aligned with the retention portion of the aperture to prevent the protrusion from being withdrawn out of the slot in an axial direction. With the protrusion then captured by an aperture in a retainer, to prevent movement back toward the receiving portion of the slot, the mounting protrusion can thus be relatively securely retained within the slot and thereby relatively securely attach the associated manifold to the mounting structure.

In this regard, for example, the spool bushing 118 has a groove 132 extending around the periphery of the spool bushing 118. The groove 132 has a proximal sidewall 134 and a distal sidewall 136. As shown, the distal sidewall 136 can be disposed at an oblique angle 138 away from the proximal sidewall 134 (see FIG. 7). The angle 138 of the distal sidewall 136s can aid in receiving the mounting structure 20 during the process of securing the manifold to the mounting structure 20 by encouraging the engagement and movement of the spool bushing 118 within the keyhole slot 22. For example, due to the angled configuration of the distal sidewall 136, initial contact between the walls of the keyhole slot and the distal sidewall 136 as the spool bushing 118 is moved into engagement with the keyhole slot 22 can cause the spool bushing 118—and the manifold 10—to be drawn into tighter engagement with the mounting structure 20.

Generally, other types of protrusions with circumferential (or other) grooves can be provided as mounting features, to operate similarly to the spool bushing 118 or other protruding mounting features disclosed herein. Further, in some cases, a spool or other structure may have a major width (e.g., diameter) and a minor width (e.g., diameter) that are generally similar to the configuration shown for the spool bushing 118, but with differently configured groove sidewalls.

In some embodiments, a locking feature (not shown) can be included on a retainer to affirmatively engage with a mounting (or other) structure and thereby secure the retainer in a particular (e.g., captured) orientation. For example, a snap-in tab (not shown) extending from the body 102 of the retainer 100 can be engaged with a reciprocal part of a snap-in tab assembly on the mounting structure 20. Such a locking feature can maintain the position of the retainer 100 relative to the mounting structure 20 when the spool bushing 118 is captured within the aperture 108. In some cases, this arrangement or others like it may reduce the likelihood of accidental or unintentional flexing of a retainer away from a mounting structure. The locking feature can also provide further tactile feedback of securing a manifold to a mounting structure after captivation of a relevant mounting feature.

In some implementations, devices or systems disclosed herein can be utilized or installed using methods embodying aspects of the invention. Correspondingly, description herein of particular features or capabilities of a device or system is generally intended to inherently include disclosure of a method of using such features for intended purposes and of implementing such capabilities. Similarly, express discussion of any method of using a particular device or system, unless otherwise indicated or limited, is intended to inherently include disclosure, as embodiments of the invention, of the utilized features and implemented capabilities of such device or system.

For example, with reference to FIGS. 1-4, some embodiments can include a method by which a user can secure a connection between a manifold 10 and a mounting structure 20, using a retainer (e.g., the retainer 100) and a protrusion from the manifold 10 (e.g., the spool bushing 118). To secure the connection, a user can first align the manifold 10 with the mounting structure 20. The user can then insert the spool bushing 118 into the receiving portion 24 of the keyhole slot 22 in an axial insertion direction (e.g., aligned with a center axis of the spool bushing 118), as facilitated by the larger size of the receiving portion 24 of the keyhole slot 22 as compared to the major diameter of the spool bushing 118. As received through the receiving portion 24, the spool bushing 118 can contact the retainer 100, located on the opposite side of the mounting structure 20, and thereby flex the retainer 100 away from the mounting structure 20 about the flex axis 116. The user can then move the manifold 10 (e.g., actively, or by allowing gravity to move the manifold 10) so that the spool bushing 118 translates within the keyhole slot 22 in a seating direction, from the receiving portion 24 to the retention portion 26, and side walls of the retention portion 26 of the slot 22 are received within the groove 132. As a result of this translational movement, the spool bushing 118 also moves relative to the retainer 100, and when the spool bushing 118 is appropriately within the retention portion 26 (e.g., seated at a bottom end thereof), the spool bushing 118 aligns with the aperture 108 and can be received therein as the retainer resiliently rebounds back toward the mounting structure. The aperture 108 correspondingly can capture the spool bushing 118 and thereby generally prevent movement of the manifold 10 relative to the mounting structure 20.

To release the manifold 10 from the mounting structure 20, a user can flex the retainer 100 away from the mounting structure 20 about the flex axis 116 to place the retainer 100 in a release configuration (e.g., as shown in FIGS. 1 and 2). As also noted above, some embodiments include a release tab (e.g., the tab 112) that a user can manually engage (e.g., push without the use of tools) to flex a retainer and thereby release a manifold, although other approaches are also possible.

Once the retainer 100 has been sufficiently flexed, the aperture 108 no longer captures the spool bushing 118 and the spool bushing 118 can be moved by the user from the retention portion 26 to the receiving portion 24 of the slot 22 (i.e., can be translated opposite the seating direction). The user can then remove the spool bushing 118 from the mounting structure 20 (i.e., opposite the axial insertion direction), thereby releasing the manifold from the mounting structure 20.

Figure 8A:
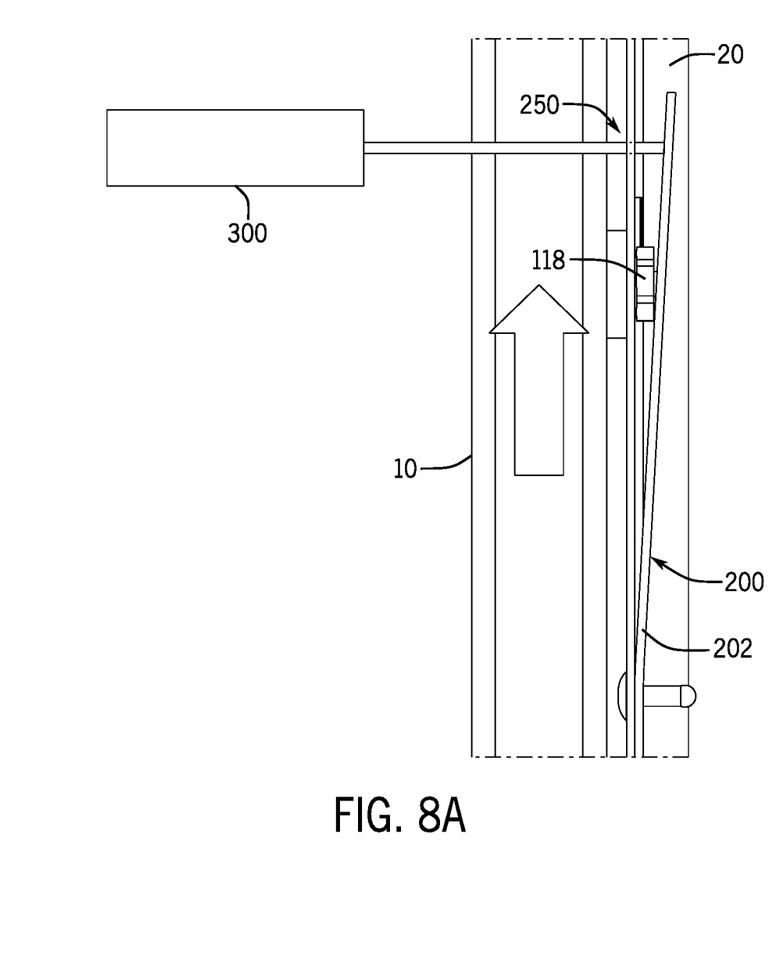
FIGS. 8A and 8B show operations for removing a manifold from a mounting structure (or, in reverse, for attaching the manifold to the mounting structure).
Figure 8B:
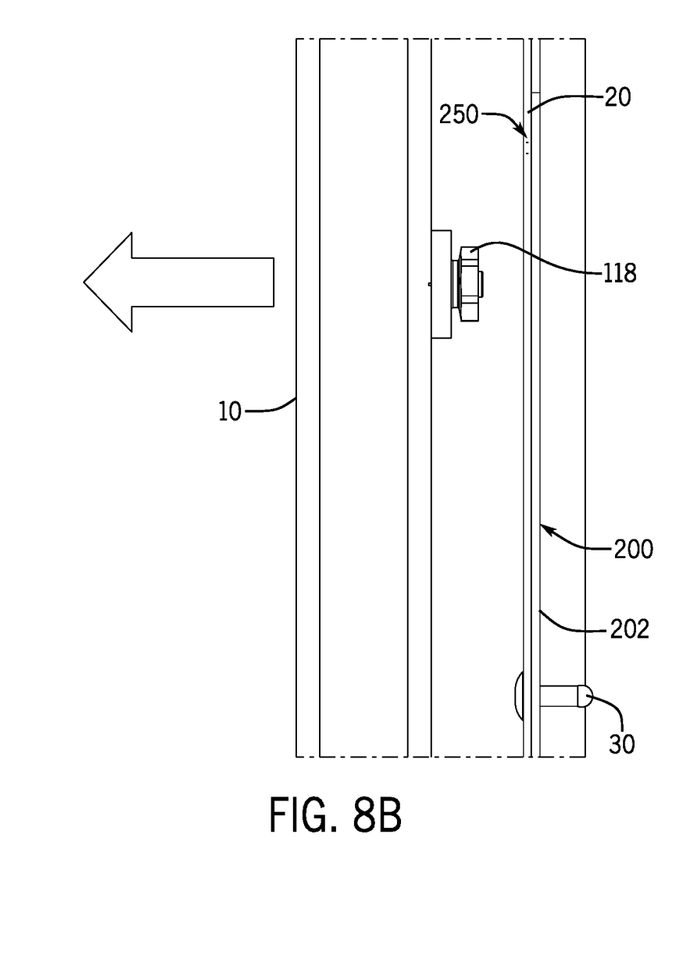

In some embodiments, other structures can be provided to allow a user to flex a retainer away from a mounting structure and thereby decapture a mounting feature. For example, as shown in FIGS. 8A and 8B, a method similar to the method discussed above can be used to mount or demount the manifold 10 relative to the mounting structure 20. In particular, as shown in FIG. 8A, a hand tool 300 (e.g., a screwdriver) can be inserted through a release aperture 250 in the mounting structure 20 to flex a free end of a body 202 of a retainer 200 away from the mounting structure 20 so that the bushing 118 (or another protrusion) can be decaptured by the retainer 200 and thereby released to be slid upward and then away from the mounting structure 20. Further, in the illustrated example, no release tab similar to the release tab 112 (see, e.g., FIGS. 1-4) is provided and the retainer 200 is arranged entirely on one side of the mounting structure 20, as may be beneficial for security and aesthetics in some installations.

Thus, embodiments of the invention can provide improved securement of the connection between a manifold and a mounting structure for shipping, installation, or while in use. In some embodiments, for example, a retainer can be affixed to the mounting structure and can be engaged during the connection of the manifold and mounting structure with no additional steps (e.g., with no direct engagement of the retainer by a user). The retainer can be configured to flex during the connection and rebound to capture a mounting feature that connects the manifold and the mounting structure.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A manifold system for a cooling system, the manifold system comprising:

a manifold with a mounting protrusion;

a mounting structure with a keyhole slot, with a receiving portion of the keyhole slot being sized to receive the mounting protrusion and a retention portion of the keyhole slot, in communication with the receiving portion, being sized to retain the mounting protrusion, wherein the receiving portion defines a first diameter and the retention portion defines a second diameter, the second diameter being smaller than the first diameter; and a retention plate having a first end and a second end opposite the first end, the retention plate affixed to the mounting structure at the second end to define a flex axis, the retention plate being flexible at the flex axis to flex between a retention configuration and a release configuration, with the second end of the retention plate being farther from the mounting structure in the release configuration than in the retention configuration;

the retention plate having an aperture in the first end, the aperture being positioned to overlap with the retention portion of the keyhole slot; and the retention plate being configured to:

flex away from the mounting structure to the release configuration upon contact with the mounting protrusion, when the mounting protrusion is received through the receiving portion of the keyhole slot; and rebound toward the mounting structure to the retention configuration when the mounting protrusion is received within the retention portion of the keyhole slot, to capture the mounting protrusion in the retention portion and secure the manifold to the mounting structure.

2. The manifold system of claim 1, wherein the retention plate is flush with and parallel to the mounting structure, on an opposite side of the mounting structure from the manifold, when the retention plate is in the retention configuration to capture the mounting protrusion in the keyhole slot.

3. The manifold system of claim 1, further comprising:
a release tab extending from the retention plate through the mounting structure toward the manifold, the release tab being placed to be urged toward the mounting structure to flex the retention plate to the release configuration.

4. The manifold system of claim 3, wherein the release tab has a form-stop configured to contact the mounting structure when the retention plate has flexed to or past the release configuration.

5. The manifold system of claim 1, wherein the first end of the retention plate has a first-end width measured along a direction of the flex axis;
wherein the first end of the retention plate further includes a notch with a notch width measured along the direction of the flex axis; and
wherein the notch width is in a range of about 25 percent to about 75 percent of the first-end width.

6. The manifold system of claim 1, wherein the retention plate includes a first part, a second part, and a third part, wherein the retention aperture is defined in the third part, and wherein the first and second parts do not include the aperture, wherein the first part is aligned with the receiving portion of the keyhole slot when the retention plate is in the retention configuration.

7. The manifold system of claim 6, wherein the mounting structure includes a release aperture; and
wherein the second part is aligned with the release aperture so that the retention plate is arranged to be flexed to the release configuration by contact with a tool inserted through the release aperture.

8. A manifold system for securing a manifold of a cooling system to a mounting structure, the manifold system comprising:
a mounting structure with a slot having a first portion and a second portion that is narrower than the first portion;
a retainer having a retainer body, the retainer body having a first end, a second end opposite the first end, and an aperture in the first end, the second end of the retainer body being affixed to the mounting structure so that the aperture is positioned adjacent the second portion of the slot; and
a bushing having a major diameter and a groove with a minor diameter, the bushing extending along a bushing axis and being configured to be secured to the manifold to extend away from the manifold to be received through the slot, the major diameter being sized to be received in the first portion of the slot but not in the second portion of the slot, and the minor diameter being sized to be received in the first and second portions of the slot;
the retainer body configured to be deflected away from the mounting structure upon contact with the bushing, when the bushing extends through the first portion of the slot, and to rebound to receive the bushing within the aperture and thereby capture the bushing within the slot when the groove of the bushing is slid into the second portion of the slot.

9. The manifold system of claim 8, wherein the groove has a proximal sidewall and a distal sidewall, the distal sidewall disposed at an oblique angle relative to the proximal sidewall.

10. The manifold system of claim 8, wherein the bushing is a polymeric bushing and includes a bore that is configured to receive a threaded stud of the manifold.

11. The manifold system of claim 10, wherein the bore of the bushing has a bore length and is threaded along a first portion of the bore length and not threaded along a second portion of the bore length.

12. The manifold system of claim 11, wherein the first portion extends about 70 percent of the bore length.

13. The manifold system of claim 8, further comprising:
a release tab extending from an edge of the retainer body at the first end of the retainer body and extending through a hole in the mounting structure to protrude from the mounting structure on a same side of the mounting structure as the manifold, the release tab being located to be urged toward the mounting structure to flex the first end of the retainer body away from the mounting structure.

14. The manifold system of claim 13, wherein the release tab extends as a bent component with a free end configured to contact the mounting structure when the retainer body has flexed a predetermined distance.

15. The manifold system of claim 14, wherein the release tab is integral with the retainer body.

16. The manifold system of claim 8, wherein the retainer further comprises a notch that extends into the retainer body at the second end, between a first location and a second location at which the retainer body is affixed to the mounting structure.

17. The manifold system of claim 16, wherein the notch extends past the first and second locations, in a direction extending from the second end of the retainer body toward the first end of the retainer body.

18. The manifold system of claim 8, wherein the mounting structure includes a release aperture; and
wherein a solid portion of the second end of the retainer body at least partly overlaps with the release aperture, the retainer body being thereby adapted to be engaged via the release aperture to be deflected away from the mounting structure.

19. A method for mounting or demounting a manifold, the method comprising:
aligning a manifold assembly with a mounting structure;
moving the manifold assembly toward the mounting structure to insert a mounting protrusion of the manifold assembly in an axial insertion direction into a receiving portion of a keyhole slot on the mounting structure, the receiving portion having a first diameter, whereby the mounting protrusion extends through the keyhole slot to contact a retention plate that is secured to the mounting structure at a first end of the retention plate and flexes the retention plate to deflect a second end of the retention plate away from the mounting structure; and
moving the manifold assembly along the mounting structure in a seating direction to move the mounting protrusion from the receiving portion of the keyhole slot into a retention portion of the keyhole slot, the retention portion having a second diameter, the second diameter being smaller than the first diameter, that prevents movement of the mounting protrusion out of the keyhole slot in a direction opposite the axial insertion direction, whereby the retention plate resiliently unflexes to move the second end of the retention plate toward the mounting structure so that the mounting protrusion is received in an aperture in the first end of the retention plate that is aligned with the retention portion of the keyhole slot and the mounting protrusion is thereby captured in the retention portion of the keyhole slot against movement in a direction opposite the seating direction.

20. The method of claim 19, further comprising:

with the mounting protrusion retained in the retention portion of the keyhole slot, manually engaging the retention plate to deflect the second end of the retention plate away from the mounting structure and thereby remove the mounting protrusion from the aperture;

with the second end of the retention plate deflected away from the mounting structure, moving the manifold assembly along the mounting structure in the direction opposite the seating direction to move the mounting protrusion to the receiving portion of the keyhole slot; and moving the manifold assembly away from the mounting structure, in the direction opposite the axial insertion direction, to remove the mounting protrusion from the keyhole slot.

\* \* \* \* \*